United States Patent [19]

Porter

[11] Patent Number: 5,365,749
[45] Date of Patent: Nov. 22, 1994

[54] COMPUTER COMPONENT COOLING SYSTEM WITH LOCAL EVAPORATION OF REFRIGERANT

[75] Inventor: Warren W. Porter, Escandido, Calif.

[73] Assignee: NCR Corporation, Dayton, Ohio

[21] Appl. No.: 172,309

[22] Filed: Dec. 23, 1993

[51] Int. Cl.[5] .............................................. F25D 23/12
[52] U.S. Cl. .............................. 62/259.2; 165/104.33; 361/700
[58] Field of Search ..................... 62/259.2, 51.1, 51.2, 62/62.2; 165/104.33; 361/688, 691, 696, 689, 699, 700

[56] References Cited

U.S. PATENT DOCUMENTS

| | | | |
|---|---|---|---|
| 3,609,991 | 10/1969 | Chu et al. | 62/333 |
| 3,917,370 | 11/1975 | Thornton et al. | 339/16 R |
| 4,392,362 | 7/1983 | Little | 62/51.1 |
| 5,144,531 | 9/1992 | Go et al. | 361/382 |

Primary Examiner—John M. Sollecito
Attorney, Agent, or Firm—James M. Stover

[57] ABSTRACT

A cooling system for a computer system which includes at least one component which generates substantial thermal energy. The cooling system includes a heat exchanger formed of a thermally conductive material which is attached to the heat generating component, the heat exchanger including an internal expansion chamber. A first conduit provides a pressurized liquid refrigerant supplied from a refrigeration compressor unit to the expansion chamber, wherein the pressurized liquid refrigerant is evaporated absorbing heat from the heat exchanger and the attached heat generating component. A second conduit provides egress of the evaporated refrigerant from the expansion chamber, returning the evaporated refrigerant to the compressor. The first conduit has a smaller diameter than the second conduit and is placed coaxial with and within the second conduit. The coaxial arrangement of the first and second conduits serves two purposes. The evaporated coolant and the second conduit are heated through thermal contact with the first conduit containing pressurized liquid coolant having a higher temperature than the evaporated coolant, reducing the formation of condensation on the second conduit; and the pressurized refrigerant is pre-cooled prior to evaporation within the expansion chamber through thermal contact with the second conduit containing the evaporated coolant which has a lower temperature than the pressurized liquid coolant.

10 Claims, 7 Drawing Sheets

COMPUTER COMPONENT COOLING SYSTEM WITH LOCAL EVAPORATION OF REFRIGERANT

The present invention relates to a cooling system for a computer system and, more particularly, to a liquid refrigerant cooling system for a multi-processor computer system employing local evaporation of refrigerant at each processor site.

BACKGROUND OF THE INVENTION

The increase in circuit density and operating frequency of integrated circuits and multi-chip modules utilized in present day computer systems has resulted in an exponential increase in the power dissipated by those components. For example, just a few years ago the maximum power generated by a typical complementary metal oxide semiconductor (CMOS) central processor unit (CPU) utilized within a personal computer was in the neighborhood of two watts. Currently, the Intel Corporation Pentium processor dissipates an estimated sixteen watts, and the next generation Intel Corporation processor is estimated to generate near thirty watts. Cooling arrangements must be provided to prevent damage to these integrated circuits from the high temperatures generated by the devices. Traditional cooling techniques such as radiation or convection into the atmosphere are no longer adequate to provide the heat removal required for these high power integrated circuits.

In addition to cooling to prevent damage resulting from overheating, it is known that a CMOS circuit will operate at higher clock speeds as the circuit temperature is lowered. In some cases the processor frequency of CMOS processor has been improved to near 300% through the cooling of the processor die to a temperature of approximately −-200° C. Many methods for sub-cooling processors and other computer components are known. One such cooling system comprises a plurality of hollow cold plates which are attached to the processors, modules or other components to be cooled. A liquid coolant is circulated from a refrigeration unit through connecting conduits to the cold heads to effectuate cooling of the attached components. Other known cooling methods include immersion of the CPU module in a coolant such as liquid nitrogen, or interfacing the CPU module with a Peltier TEC (thermal electric cooling) device.

The requirement for cooling of high power components presents additional considerations and difficulties in the design, construction and operation of a computer system. For example, an immersion or liquid cooling system as described above requires thick insulation of conduits, cold plates and other cooling system components, taking up valuable cabinet space. Unavoidable heat leakage requires that the cooling system be oversized to allow for losses. An additional concern is that condensation may form on the cold elements of the cooling system, such as the conduits and cold heads. This condensation can damage electrical components within the computer system.

OBJECTS OF THE INVENTION

It is therefore an object of the present invention to provide a new and useful cooling system for a computer system which is not subject to the above disadvantages.

It is another object of the present invention to provide a liquid cooling system for a multi-processor computer system which eliminates the need for insulated conduit and its associated problems.

It is yet another object of the present invention to provide a liquid cooling system for a multi-processor computer system wherein warm high pressure liquid refrigerant is locally evaporated at the processor sites to effectuate cooling of the processors.

It as an additional object of the present invention to provide such a cooling system wherein conduit utilized to return cool gaseous refrigerant from the processor sites is heated to prevent condensation formation.

It is still a further object of the present invention to provide such a cooling system employing coaxial conduit including an inner conduit providing delivery of warm high-pressure liquid refrigerant to the processor sites, and an outer conduit providing for the return of cool low pressure gaseous refrigerant from the processor sites.

SUMMARY OF THE INVENTION

There is provided, in accordance with the present invention, a cooling system for a computer system which includes at least one component which generates substantial thermal energy. The cooling system comprising a heat exchanger formed of a thermally conductive material which is attached to the heat generating component, the heat exchanger including an internal expansion chamber. A first conduit having a first end which is terminated into the expansion chamber provides a pressurized liquid refrigerant supplied from a refrigeration compressor unit to the expansion chamber, wherein the pressurized liquid refrigerant is evaporated thus absorbing heat from the heat exchanger and the attached heat generating component. A second conduit having a first end which is terminated into the expansion chamber provides egress of the evaporated refrigerant, returning the evaporated refrigerant to the compressor.

In the described embodiment, the first conduit has a smaller diameter than the second conduit and is placed coaxial with and within the second conduit. Two purposes are served by this coaxial arrangement. The evaporated coolant and the second conduit are heated through thermal contact with the first conduit containing pressurized liquid coolant having a higher temperature than the evaporated coolant, reducing the formation of condensation on the second conduit. Also, the pressurized refrigerant is pre-cooled prior to evaporation within the expansion chamber through thermal contact with the second conduit containing the evaporated coolant which has a lower temperature than the pressurized liquid coolant.

The above and other objects, features, and advantages of the present invention will become apparent from the following description and the attached drawings.

DETAILED DESCRIPTION OF THE PREFERRED EMBODIMENT

Figure 1:
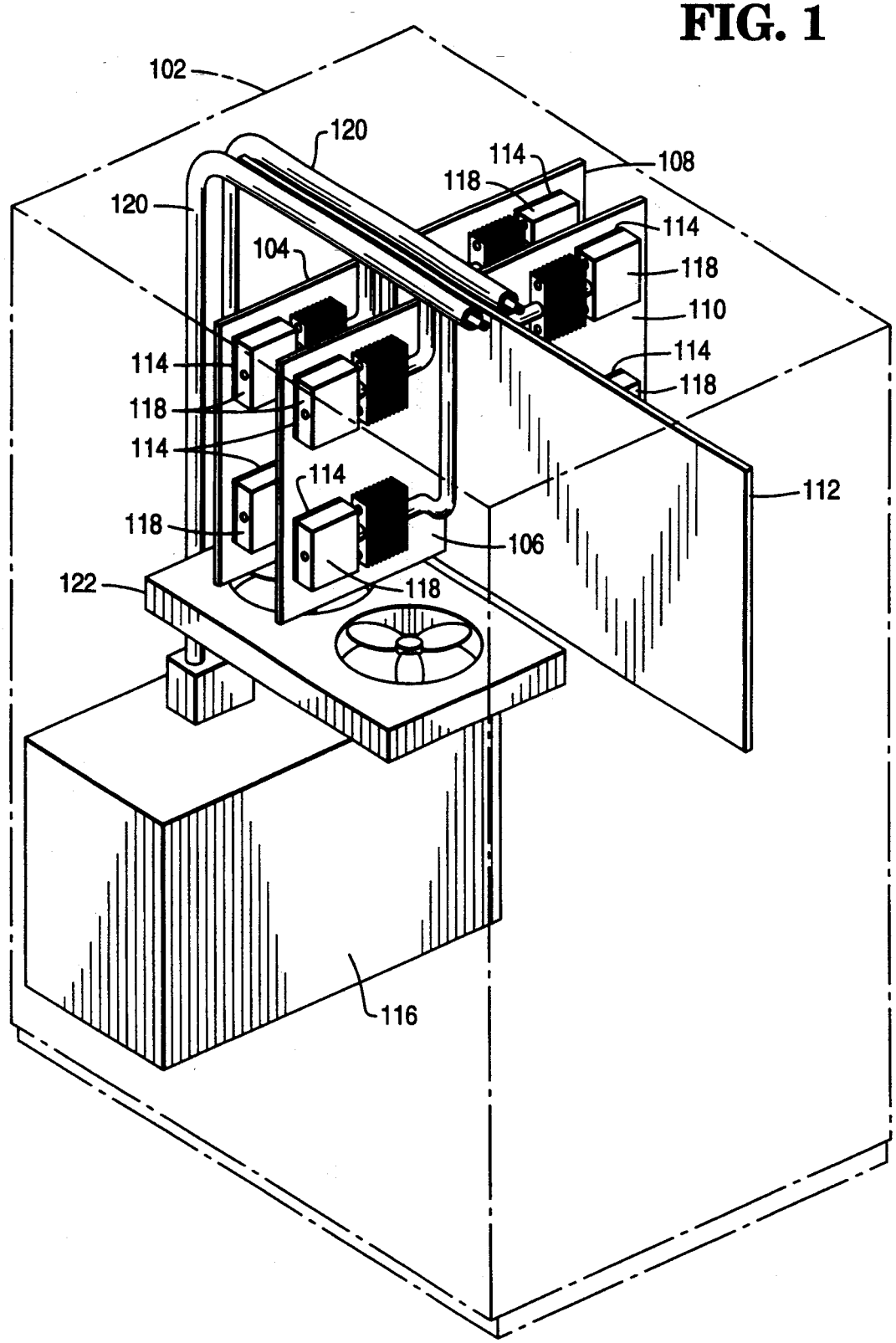
FIG. 1 is a perspective view of a processor cabinet including a plurality of printed circuit boards and the component cooling system according to the present invention.

Referring now to FIG. 1, there is seen a typical processor cabinet 102, shown in outline, which houses the components of a multiple processor computer system and includes a cooling system in accordance with the present invention. However, only those components necessary for an understanding of the present invention are shown and discussed herein. The processor cabinetry may additionally house disk drives, power supplies, memory boards and other structures not shown in FIG. 1.

The computer system includes a plurality of processor boards, four of which are shown. These boards, identified by reference numerals 104, 106, 108 and 110, each include electrical contacts along one edge which are press fitted into mating connectors secured to the surface of a system backpanel 112. The backpanel provides common connections for the transmission of power, control and data signals between the various components of the computer system. The processor boards, which will be described in greater detail below with reference to FIG. 3, each include two processors 114. Also shown in FIG. 1 is a typical fan panel 122 that generates an air flow directed upward across the processor boards and other components within the cabinet.

Figure 2:
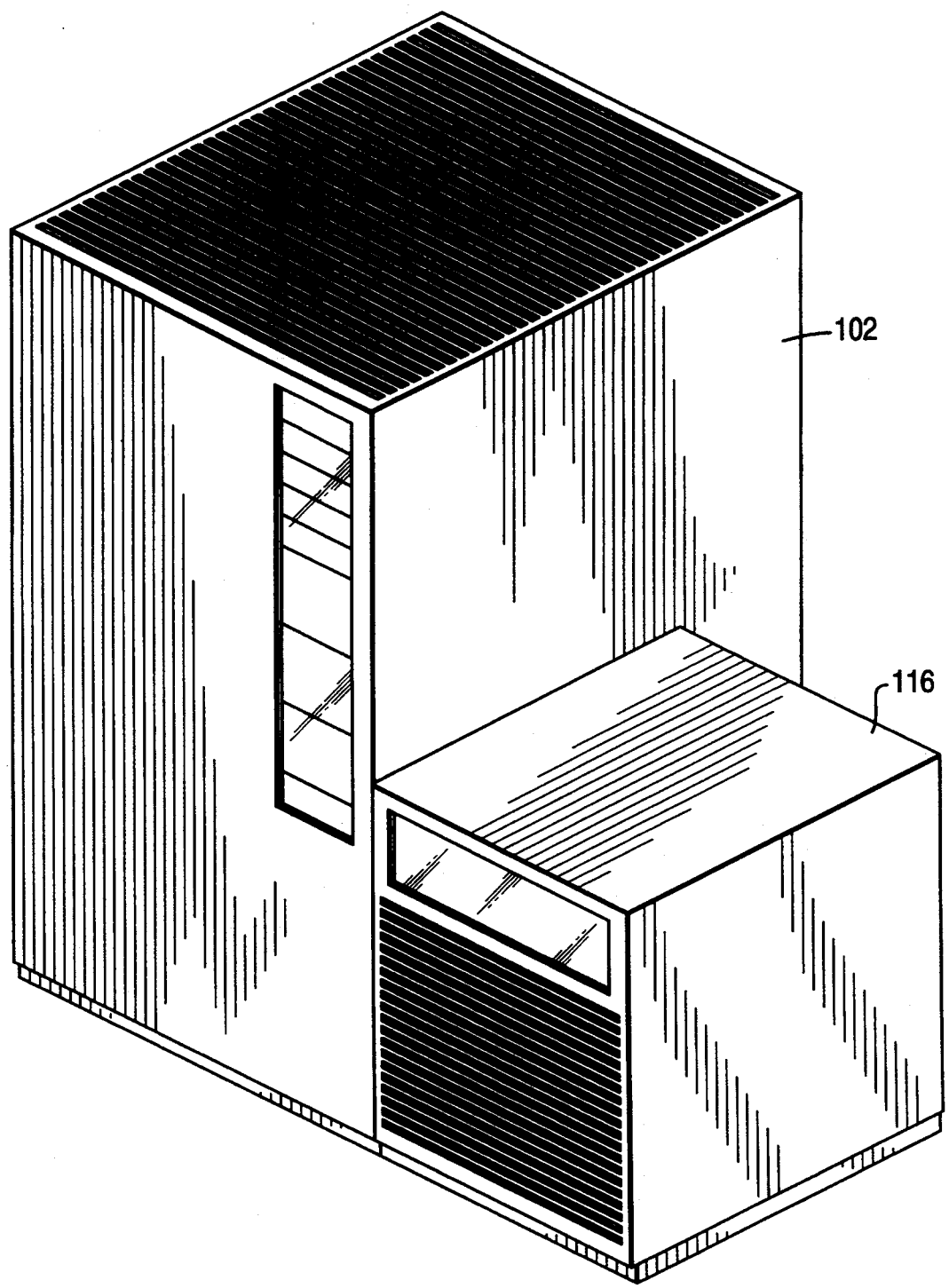
FIG. 2 is a perspective view of a processor cabinet wherein the cooling system compressor unit is located external to the cabinet.

The primary components of the cooling system shown in FIG. 1 include a refrigeration compressor unit 116, a heat exchanger/cold head assembly 118 affixed to each processor 114, and coaxial conduit 120 connecting each cold head unit with refrigeration compressor unit 116. An alternative construction of the cooling system wherein refrigeration unit 114 is located external to processor cabinet 102 is shown in FIG. 2. In the preferred embodiment of the invention, shown in FIG. 1, the refrigeration compressor unit is a two compressor compound vapor compression phase system which is located in the bottom of cabinet 102 to facilitate disconnection of the compressor unit from the conduit system for removal and service or replacement. The refrigeration compressor system provides pressurized coolant to each of the cold head units.

Figure 3:
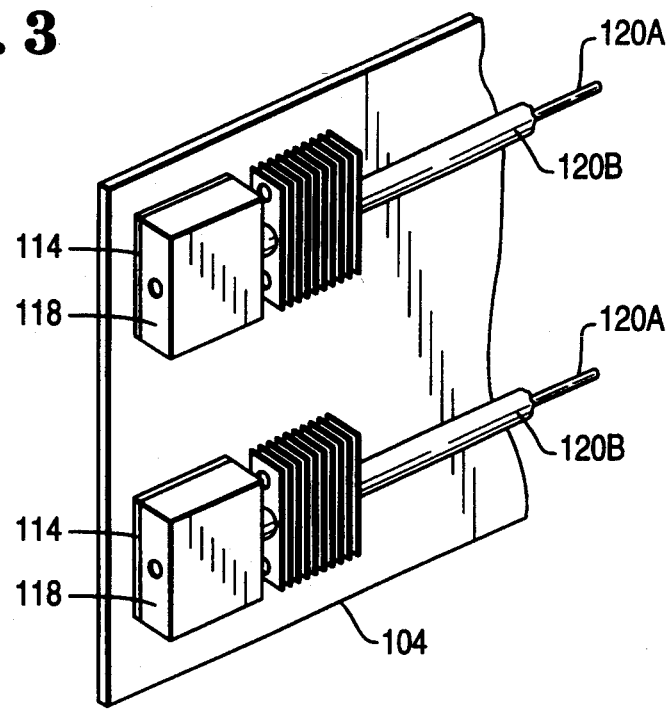
FIG. 3 is a printed circuit board subassembly, shown in perspective view, including two CPUs and corresponding CPU heat exchanger and CPU cold head components of the cooling system of the present invention.

Processor board 104 is shown in perspective view in FIG. 3. The processor board is a printed circuit board to which is attached two CPUs 114 as well as other circuit elements which are not shown. It should be noted that although the processor boards are shown including two CPUs, one, two or more processors can be accommodated on each processor board and the cooling system, described herein, designed accordingly. Attached to each CPU is a heat exchanger and cold head assembly 118. Coaxial conduit 120, which terminates into assembly 118, includes an internal, small diameter, conduit 120A which provides for the delivery of pressurized liquid coolant from the refrigeration compressor 116 to the heat exchanger/cold head assembly 118, and an outer conduit 120B which provides for the return of gaseous coolant from assembly 118 to the refrigeration compressor unit 116. In the preferred embodiment, the outside diameter of the internal conduit 120A is 1/16 of an inch while the outer conduit 120B has an outside diameter of ⅜ of an inch.

Figure 4:
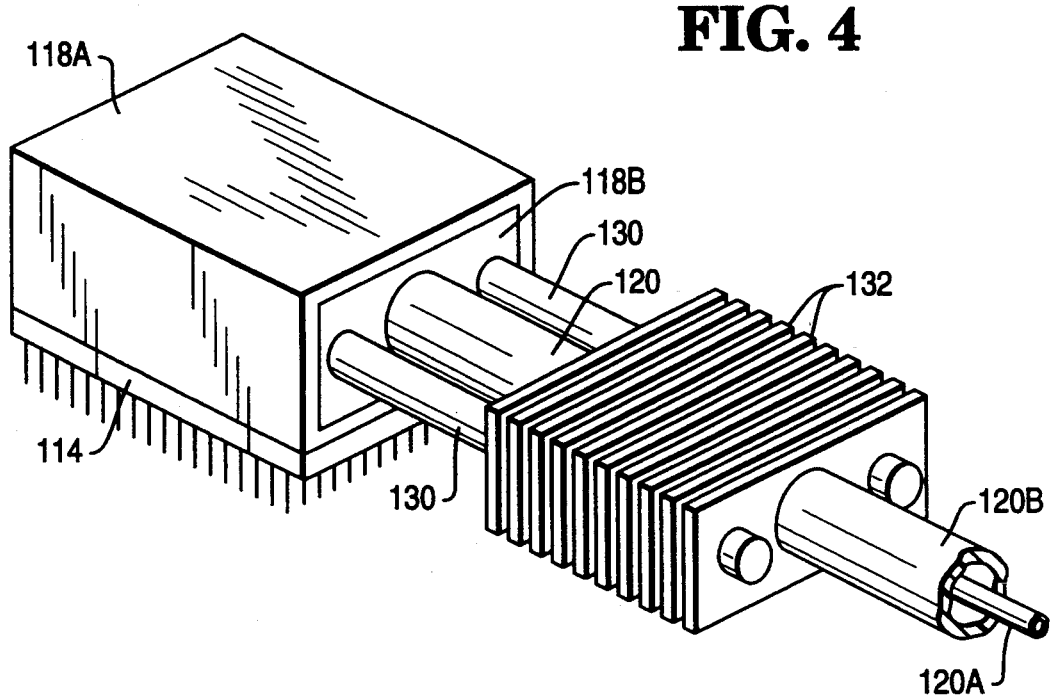
FIG. 4 is a detailed perspective view of a single CPU together with its corresponding CPU heat exchanger and CPU cold head and other local components of the cooling system of the present invention.
Figure 5:
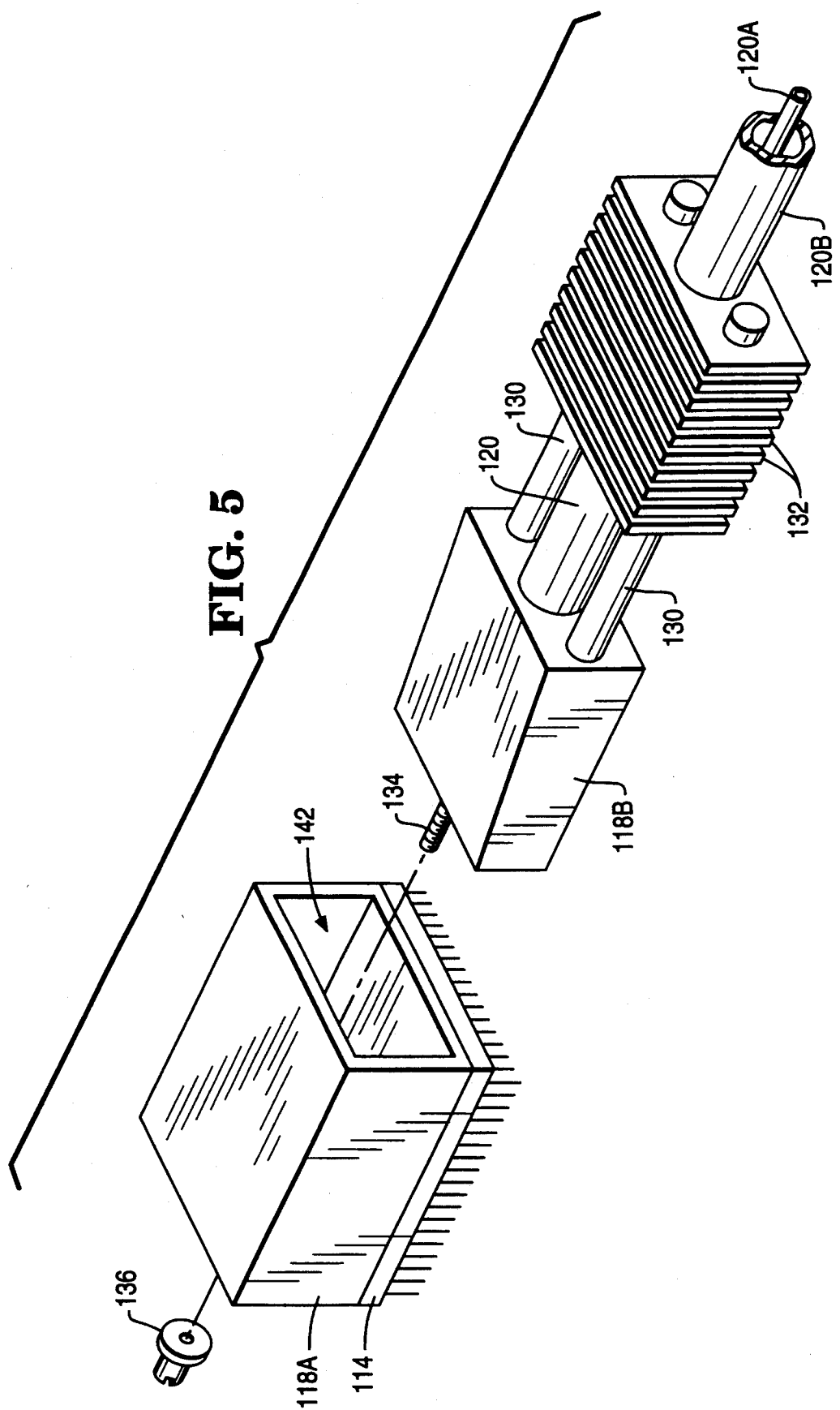
FIG. 5 is a disassembled perspective view of the structure shown in FIG. 4 wherein the CPU cold head has been separated from the CPU and CPU heat exchanger.
Figure 6:
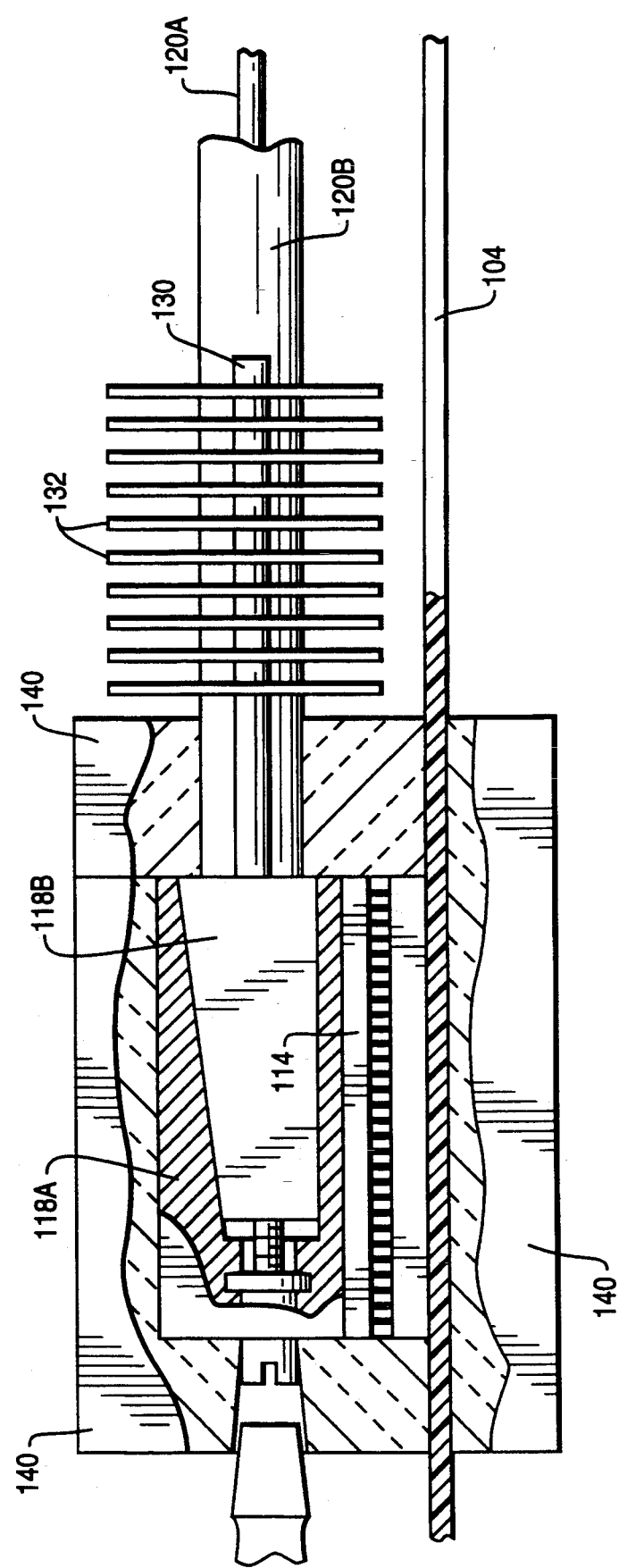
FIG. 6 is a side view, partially cut away, of the CPU and cooling components shown in FIG. 4.
Figure 7:
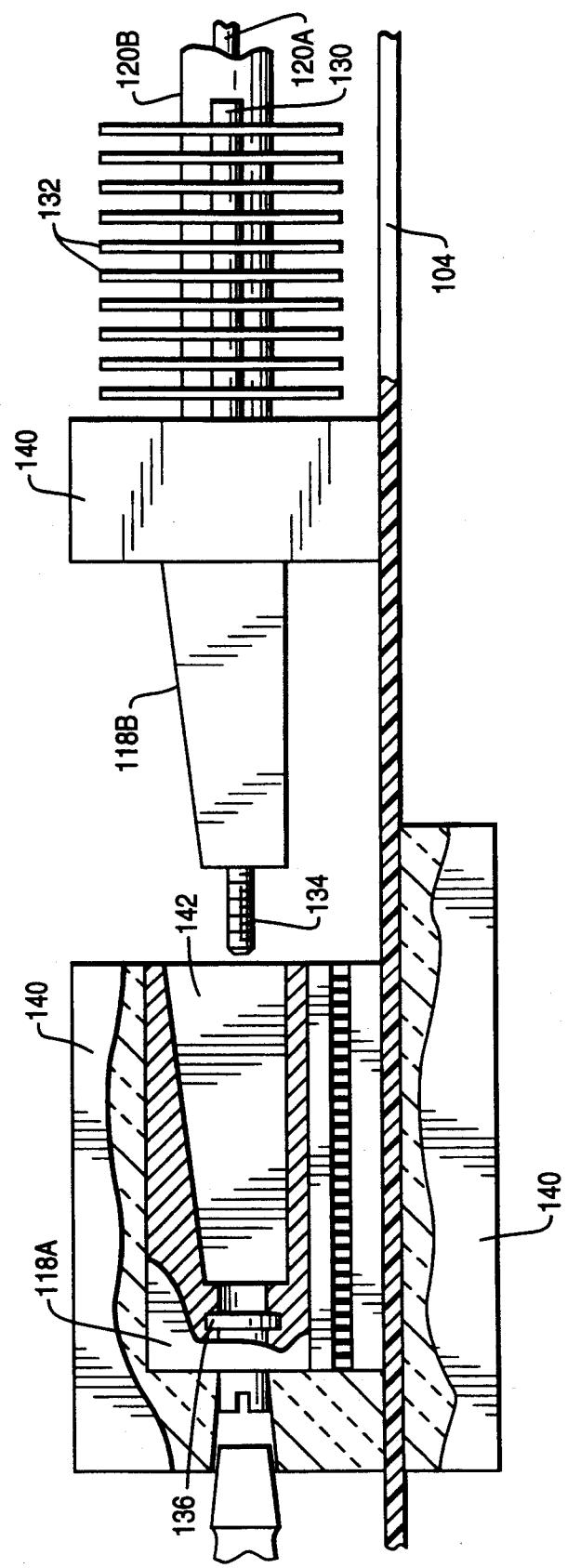
FIG. 7 is a side view, partially cut away, of the CPU and cooling components shown disassembled in FIG. 5.
Figure 8:
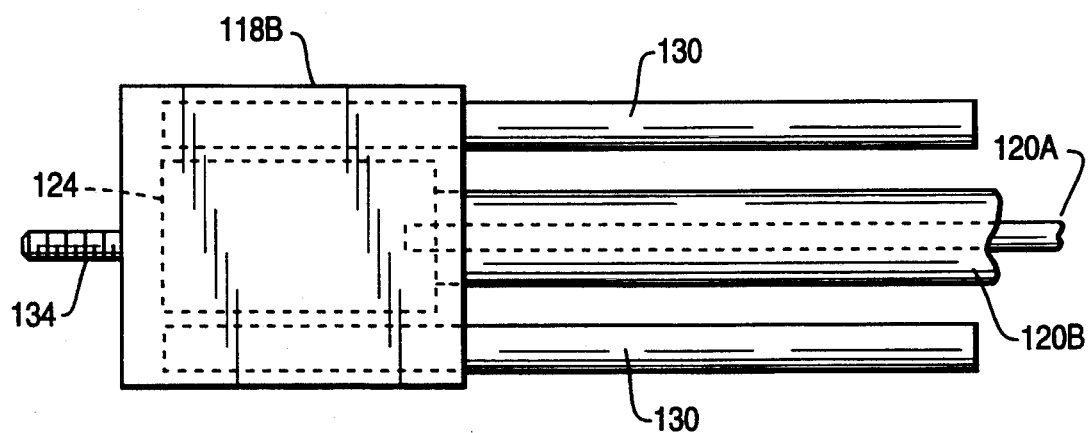
FIG. 8 is a cut-away view of cold head unit 118B, showing an internal expansion chamber 124.

The construction of heat exchanger/cold head assembly 118 will now be described with reference to FIGS. 4 through 8. FIGS. 4 and 5 show the heat exchanger/cold head assembly 118 in assembled and disassembled views, respectfully. The assembly is shown without insulation. FIGS. 6 and 7 provide side views of the heat exchanger/cold head assembly 118 in assembled and disassembled views, respectfully. Assembly 118 is seen to comprise two elements: a heat exchanger housing 118A, and a cold head unit 118B. Heat exchanger housing 118A is formed of a thermally conductive material and is thermally mated to the top surface of CPU 114 using, for example, a thermal epoxy that provides a thermal and mechanical bond. Alternatively, a thermal grease may be utilized together with a spring loaded retainer or some other means of mechanical attachment to thermally mate heat exchanger housing 118A with CPU 114. Heat exchanger housing 118A is seen to include a tapered cavity 142 into which cold head unit 118B is inserted. FIGS. 4 and 6 show the cold head unit 118B installed within heat exchanger housing 118A.

Cold head unit 118B is attached to the end of coaxial refrigerant conduits 120A and 120B. Cold head unit 118B is formed of a thermally conductive metal and is shaped to mate with cavity 142 within heat exchanger housing 118A. The cold head unit includes an internal expansion chamber 124, shown in FIG. 8, into which conduits 120A and 120B extend. Also forming a part of cold head unit 118B are heat pipes 130 which connect the cold head with a set of cooling fins 132. The cold head 118B, refrigerant conduits 120A and 120B, and heat pipes 130 are permanently connected with solder, braze or welding.

To secure the assembly of cold head unit 118B within heat exchanger housing 118A, a threaded stud 134 is provided extending from the forward end of cold head unit 118B. Stud 134 extends through a hole provided in the back wall of heat exchanger housing 118A when the cold head is installed. A jack screw 136 is threaded unto screw 134 to firmly retain the cold head within the heat exchanger and facilitate the removal of the cold head. The tapered shape of cold head 118B and cavity 142 provides a means for forcing the mating surfaces tightly together to improve thermal conduction between the elements. A non-hardening compound is provided between the surfaces to enhance thermal conduction between the structures and facilitate disassembly of the cold head unit from the heat exchanger.

The section view of FIGS. 6 and 7 show insulation 140 applied around the heat exchanger/cold head assembly. The insulation serves to minimize heat leak into the cooling system and to prevent condensation from forming on the cold surfaces. A supplementary insulation heater may be required to prevent the formation of condensation. A heater may also be provided to warm the relatively thermally conductive printed circuit board 104 to prevent condensation around the perimeter of the insulation.

The operation of the closed cooling system described herein is as follows. Refrigeration compressor 116 provides warm, high pressure, liquid coolant to the conduit 120A for distribution to each of the cold head units 118B. Each cold head unit functions as an evaporator for the cooling system. The high pressure liquid provided to expansion chamber 124 within each cold head unit is evaporated, absorbing heat from the cold head 118B and thermally attached heat exchanger housing 118A and processor 114. The subsequent expansion lowers the temperature of the coolant. Additional structure, such as an expansion valve, may be included within the expansion chamber 124 or within the liquid coolant delivery conduit 120A to regulate the evaporation of the coolant.

The cold, low pressure, gaseous coolant is returned from the cold head units to refrigeration compressor unit 116 through conduit 120B, where the coolant is re-compressed into a warm, high pressure, liquid and again circulated to the heat exchanger/cold heat assemblies attached to the multiple processors of the computer system.

By locating the liquid coolant delivery conduit 120A internal to return conduit 120B the warmer, high pressure, liquid refrigerant being delivered to the cold head units is cooled through counter flow heat exchange with the returning cool, low pressure, gaseous refrigerant which is, in turn, warmed. Two benefits are realized through this exchange. First, the liquid refrigerant is thereby pre-cooled so that the cold head unit temperature is proportionally lowered. Second, the returning gaseous refrigerant is heated by the thermal exchange with the liquid coolant, so that the temperature of return conduit 120B is higher, thereby preventing the formation of condensation on the conduit surface. Is necessary, conduit 120B can also be electrically heated to further warm the return gaseous refrigerant.

Heat pipes 130 and cooling fins 132 are provided to remove heat generated by the CPUs should the refrigeration unit be out of operation, thereby lowering the risk of thermal damage to the CPUs. The cooling fins are also thermally connected to return conduit 120B to provide additional heat to the returning gaseous coolant to assist in the prevention of the formation of unwanted condensation. The section of heat pipes 130 and return conduit 120A between each cold head unit and the closest cooling fin is formed of thin wall stainless steel tubing to limit heat flow to the cold heads.

The design of the heat exchanger/cold head assemblies 118 permits the removal of a processor board without opening the closed refrigeration system.

It can thus be seen that there has been provided by the present invention a liquid cooling system for a multi-processor computer system which eliminates the need for insulated conduit and its associated problems. The cooling system employs coaxial conduit including an inner conduit providing delivery of warm, high-pressure, liquid refrigerant to the processor sites, and an outer conduit providing for the return of cool, low pressure, gaseous refrigerant from the processor sites. The processors are cooled through local evaporation of the liquid coolant at the processor sites. The coaxial placement of the warm high pressure delivery conduit within the return conduit heats the return conduit thereby preventing the formation of condensation on the external conduit surface.

Although the presently preferred embodiment of the invention has been described, it will be understood that various changes may be made within the scope of the appended claims. For example, components other than the computer system CPUs may also be cooled by the present invention.

What is claimed is:

1. In a computer system including at least one component which generates substantial thermal energy, a cooling system comprising:
 a heat exchanger comprising a thermally conductive material, said heat exchanger and said thermally conductive material being in thermal contact with said component said heat exchanger including an internal expansion chamber;
 a first conduit having a first end which is connected with said expansion chamber for providing a pressurized refrigerant to said expansion chamber;
 whereby said pressurized refrigerant is expanded within said expansion chamber absorbing heat from said heat exchanger and said attached component; and
 a second conduit having a first end which is connected with said expansion chamber for providing egress of the expanded refrigerant;
 wherein said first conduit has a smaller diameter than said second conduit and is placed coaxial with and within said second conduit;
 whereby said expanded refrigerant and said second conduit are heated through thermal contact with said first conduit.

2. In a computer system including at least one component which generates substantial thermal energy, cooling system comprising:
 a heat exchanger comprising a thermally conductive material, said heat exchanger and said thermally conductive material being in thermal contact with said component, said heat exchanger including an internal expansion chamber;
 a first conduit having a first end which is connected with said expansion chamber for providing a pressurized refrigerant to said expansion chamber;
 whereby said pressurized refrigerant is expanded within said expansion chamber absorbing heat from said heat exchanger and said attached component;
 a second conduit having a first end which is connected with said expansion chamber for providing egress of the expanded refrigerant; and
 means for pre-cooling said first conduit to cool said pressurized refrigerant prior to expansion within said expansion chamber.

3. In a computer system including at least one component which generates substantial thermal energy, a cooling system comprising:
 a heat exchanger comprising a thermally conductive material, said heat exchanger and said thermally conductive material being in thermal contact with said component, said heat exchanger including an internal expansion chamber;
 a first conduit having a first end which is connected with said expansion chamber for providing a pressurized refrigerant to said expansion chamber;
 whereby said pressurized refrigerant is expanded within said expansion chamber absorbing heat from said heat exchanger and said attached component;
 a second conduit having a first end which is connected with said expansion chamber for providing egress of the expanded refrigerant; and means for heating said second conduit to prevent condensation from forming thereon.

4. In a computer system including at least one component which generates substantial thermal energy, a cooling system comprising:
- a heat exchanger comprising a thermally conductive material, said heat exchanger and said thermally conductive material being in thermal contact with said component, said heat exchanger including an internal expansion chamber;
- a first conduit having a first end which is connected with said expansion chamber for providing a pressurized refrigerant to said expansion chamber;
- whereby said pressurized refrigerant is expanded within said expansion chamber absorbing heat from said heat exchanger and said attached component; and
- a second conduit having a first end which is connected with said expansion chamber for providing egress of the expanded refrigerant;
- and wherein said heat exchanger further comprises:
  - a cold head unit formed of a thermally conductive material and including said internal expansion chamber, said first conduit being connected to said cold head for providing said pressurized liquid refrigerant to said expansion chamber, said second conduit being connected to said cold head for providing for the return of evaporated refrigerant to said refrigeration compressor unit; and
  - a housing thermally attached to said component, said housing including a cavity for receiving said cold head unit;
  - whereby said cold head unit can be readily removed from and installed into said cavity.

5. A closed liquid cooling system for a multiple processor computer system, comprising:
- a refrigeration compressor unit for supplying a pressurized liquid coolant;
- a heat exchanger corresponding to each processor in said computer system, each one of said heat exchangers being formed of a thermally conductive material and attached to its corresponding processor, said heat exchanger including an internal expansion chamber;
- a first conduit connecting said refrigeration compressor unit with each one of said heat exchangers, said first conduit providing said pressurized liquid refrigerant to each one of said expansion chambers;
- whereby said pressurized liquid refrigerant is evaporated within said expansion chambers absorbing heat from said heat exchangers and their corresponding processors; and
- a second conduit connecting said refrigeration compressor unit with each one of said heat exchangers, said second conduit providing for the return of the evaporated refrigerant to said refrigeration compressor unit.

6. The closed liquid cooling system according to claim 5, wherein each one of said heat exchangers comprises:
- a cold head unit formed of a thermally conductive material and including said internal expansion chamber, said first conduit being connected to said cold head for providing said pressurized liquid refrigerant to said expansion chambers, said second conduit being connected to said cold head for providing for the return of evaporated refrigerant to said refrigeration compressor unit; and
- a housing thermally attached to the processor corresponding to said heat exchanger, said housing including a cavity for receiving said cold head unit;
- whereby said cold head unit can be readily removed from and installed into said cavity.

7. The cooling system in accordance with claim 6, wherein:
- said first conduit has a smaller diameter than said second conduit and is placed coaxial with and within said second conduit;
- whereby said evaporated gas and said second conduit are heated through thermal contact with said first conduit.

8. In a computer system including at least one component which generates substantial thermal energy, a method for cooling said component, comprising the step of:
- attaching a heat exchanger formed of a thermally conductive material to said component, said heat exchanger including an internal evaporation chamber;
- providing a first conduit having a first end which is terminated into said expansion chamber for delivering a pressurized liquid refrigerant to said expansion chamber;
- evaporating said pressurized liquid coolant within said expansion chamber to absorb heat from said heat exchanger and said attached component;
- providing a second conduit having a first end which is terminated into said expansion chamber for removal of the evaporated refrigerant from said expansion chamber: and
- heating said second conduit to prevent the formation of condensation on said second conduit.

9. The method according to claim 8, wherein:
- said step of evaporating said liquid coolant generates an evaporated coolant having a lower temperature than said liquid coolant;
- said first conduit has a smaller diameter than said second conduit and is placed coaxial with and within said second conduit;
- said evaporated coolant and said second conduit are heated through thermal contact with said first conduit containing said pressurized liquid coolant having a higher temperature than said evaporated coolant.

10. The method according to claim 9, further comprising the step of:
- pre-cooling said pressurized liquid coolant prior to evaporation within said expansion chamber, said first conduit and liquid coolant being pre-cooled through thermal contact with said second conduit containing said evaporated coolant having a lower temperature than said pressurized liquid coolant.

* * * * *